United States Patent [19]
Yao et al.

[11] Patent Number: 5,682,211
[45] Date of Patent: Oct. 28, 1997

[54] INTEGRATED DARK MATRIX FOR AN ACTIVE MATRIX LIQUID CRYSTAL DISPLAY WITH PIXEL ELECTRODES OVERLAPPING GATE DATA LINES

[75] Inventors: William Yao, Los Altos; Ronald T. Fulks, Mountain View; Jackson Ho, Palo Alto, all of Calif.

[73] Assignee: Xerox Corporation, Stamford, Conn.

[21] Appl. No.: 455,888

[22] Filed: May 31, 1995

Related U.S. Application Data

[63] Continuation-in-part of Ser. No. 235,009, Apr. 28, 1994.
[51] Int. Cl.$^6$ .............. G02F 1/1343; G02F 1/136
[52] U.S. Cl. .................................. 349/38; 349/46
[58] Field of Search ............... 359/59, 67; 349/38, 349/43, 46

[56] References Cited

U.S. PATENT DOCUMENTS

| | | | |
|---|---|---|---|
| 5,028,122 | 7/1991 | Hamada et al. | 359/59 |
| 5,068,748 | 11/1991 | Ukai et al. | 359/59 |
| 5,151,806 | 9/1992 | Kawamoto et al. | 359/59 |
| 5,182,661 | 1/1993 | Ikeda et al. | 349/38 |
| 5,185,601 | 2/1993 | Takeda et al. | 349/39 |
| 5,208,690 | 5/1993 | Hayashi et al. | 349/143 |
| 5,414,547 | 5/1995 | Matsuo et al. | 359/67 |
| 5,510,916 | 4/1996 | Takahashi | 359/59 |

FOREIGN PATENT DOCUMENTS

| | | |
|---|---|---|
| 0450941 | 10/1991 | European Pat. Off. . |
| 4-265945 | 9/1992 | Japan . |

OTHER PUBLICATIONS

H. Yamanaka et al., "Integrated Black Matrix on TFT Arrays," SID 92 Digest, 1992, pp. 789–792 no month.
Y. Matsueda et al., "HDTV Poly–Si TFT–LCD Light Valve with 70% Aperture Ratio," pp. 601–604, The Euro Display '93, 13th International Display Research Conference, Aug. 31–Sep. 3, 1993, Strasbourg, France, SID–France and SID.

*Primary Examiner*—Anita Pellman Gross
*Attorney, Agent, or Firm*—Oliff & Berridge; Eugene O. Palazzo

[57] ABSTRACT

The invention provides an integrated dark matrix for an active matrix liquid crystal display. A plurality of pixel electrodes overlap at least one of a plurality of gate lines and a plurality of data lines. A perimeter of the pixel electrodes overlaps the gate lines and/or data lines by twice the distance that the pixel electrode is above the gate and data lines, respectively to obtain a viewing angle of over 60 degrees.

12 Claims, 5 Drawing Sheets

5,682,211

INTEGRATED DARK MATRIX FOR AN ACTIVE MATRIX LIQUID CRYSTAL DISPLAY WITH PIXEL ELECTRODES OVERLAPPING GATE DATA LINES

RELATED APPLICATIONS

This application is a continuation-in-part application of parent application Ser. No. 08/235,009 filed on Apr. 28, 1994.

BACKGROUND OF THE INVENTION

1. Field of the Invention

The invention generally relates to an active matrix liquid crystal display device overlapping pixel electrodes with gate lines and data lines to achieve an integrated dark matrix using a five mask display architecture.

2. Description of Related Art

Active matrix liquid crystal displays (AMLCD) improve display quality by using thin film transistors (TFT) to drive pixel electrodes. The AMLCD is used in display portions of many high volume products such as laptops. Thus, there is great interest to improve manufacturing yields by simplifying the manufacturing processes leading to increased product reliability and reduction in product cost.

The pixel electrode in AMLCD designs usually comprises a layer of indium-tin-oxide (ITO) because the ITO is both transparent and conductive. Current AMLCD designs form a passivation layer over the ITO layer. A liquid crystal material is then placed over the passivation layer and a common electrode is formed over the liquid crystal material completing the AMLCD device.

Conventionally, the AMLCD is formed on a surface of a transparent substrate. The pixels of the AMLCD are formed by parallel gate lines and parallel data lines. The gate lines and data lines are perpendicular to each other forming a matrix of pixel regions on the surface of the substrate. A pixel electrode is formed in each pixel region and connected to a TFT.

Depending on the polarization of the liquid crystal material, a pixel is in either a normally clear state or a normally opaque state. The state of the liquid crystal mateial is controlled by the voltage potential between the common electrode and the pixel electrode. When the pixel electrode is activated, the liquid crystal material changes state either from the clear state to opaque state or vice versa.

Since the pixel electrodes are conductive and formed on the same surface level as the data lines, the pixel electrodes must be prevented from contacting the data lines, thus leaving gaps between the data liness and the pixel electrodes. For a normally clear liquid crystal material, when a pixel electrode is activated, light passes through the gaps degrading the display quality. For a normally opaque liquid crystal material, the liquid crystal material above the gap between the pixel electrodes and data lines remain always opaque regardless of the activation of the pixel electrode. However, since the data lines are shared among many pixels, the voltage potential on these signal lines change the state of the liquid crystal material above them from opaque to clear and light escapes from the gaps through these clear portions. Thus, light undesirably escapes through the gaps independent of whether the liquid crystal material is normally clear or normally opaque.

Accordingly, conventional AMLCD devices form a dark matrix on the common electrode to block the light that escapes through the gaps between the pixel electrodes and the data lines. Usually, the dark matrix overlaps the gaps by about 5 microns to achieve acceptable display quality.

Since AMLCDs are commonly used in portable devices which have limited battery lifetimes, a new AMLCD structure is designed to reduce power consumption of the AMLCD. This structure is described in detail in the parent application Ser. No. 08/235,009. The new structure places the ITO layer above the passivation layer so that the voltage necessary to drive the pixel electrode is reduced thus reducing the power consumption of the AMLCD.

Placing the ITO layer above the passivation layer increases the gap through which light can escape. The vertical distance separating the pixel electrode and the data line is increased by the thickness of the passivation layer. To maintain display quality, the dark matrix area on the common electrode must be increased. However, increasing the dark matrix area reduces the effective pixel region which also causes degradation in display quality.

SUMMARY OF THE INVENTION

An object of this invention is to provide a dark matrix by forming a plurality of gate lines over a substrate, a plurality of data lines over the substrate and a plurality of pixel electrodes over the gate and data lines so that a perimeter of each pixel electrode overlaps at least one of a portion of the gate lines and a portion of the data lines.

The pixel electrode is formed above the gate lines by a first distance and above the data lines by a second distance. The pixel electrode overlaps the gate lines by at least twice the first distance and overlaps the data lines by at least twice the second distance to obtain a viewing angle of greater than 60 degrees.

Another object of the invention is to provide a method for manufacturing a dark matrix by overlapping the pixel electrode over gate and data lines.

BRIEF DESCRIPTION OF THE DRAWINGS

The invention will be described in detail with reference to the following drawings, wherein.

DETAILED DESCRIPTION OF PREFERRED EMBODIMENTS

Figure 1:
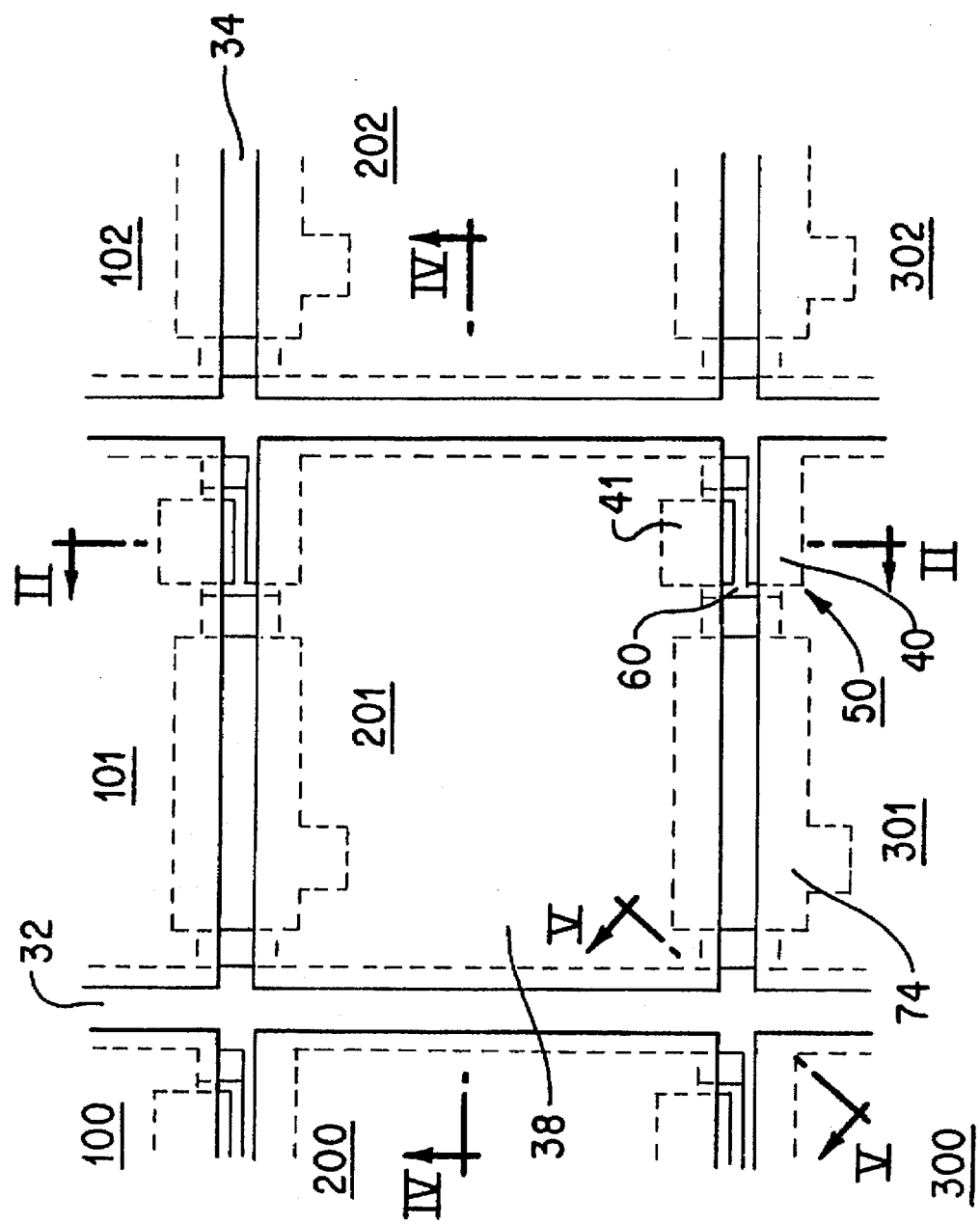
FIG. 1 is a top plan view of pixel regions.

FIG. 1 shows an AMLCD substrate surface divided into pixel regions by the gate lines 34 and data lines 32 into pixel regions 100–102, 200–202 and 300–302. Each pixel region comprises a pixel electrode 38, a TFT 50, and a pixel electrode capacitor 74.

In FIG. 1, solid lines indicate the outlines of components that are on top and dotted lines indicate outlines of components that are underneath other structures. The pixel electrodes 38 are shown in solid lines because the pixel electrodes 38 is formed above the other components shown in FIG. 1.

The pixel electrode capacitor 74 is shown mostly underneath the pixel electrode 38, however, in the gap between two adjacent pixel electrodes 38, the perimeter of the pixel electrode capacitor 74 is above all other structures shown in FIG. 1 and thus is shown using solid lines.

The TFTs 50 is shown having source electrode 41, drain electrode 40 and etch stopper 60. The TFT 50 is below the pixel electrode 38. In the gap between the pixel electrodes 38, the outlines of the source electrode 41, the drain electrode 40 and the etch stopper 60 are the top structures and shown using solid lines. Although the source electrode 41 and the drain electrode 40 is formed over the etch stopper 60, the source electrode 41 and the drain electrode 40 do not cover the total surface of the etch stopper 60.

The data lines 32 are located vertically and are underneath the pixel electrodes 38. The outline of the data lines 32 are shown as vertical dotted lines. The source electrodes 41 are shown as extensions of the data lines 32. In the gap between the pixel electrodes 38, both the source electrodes 41 and the data lines 41 are above other components shown in FIG. 1 and thus are shown using solid lines.

The gate lines 34 are located horizontally and are underneath the data lines 32, the pixel electrode capacitors 74, the TFTs 50 and the pixel electrodes 38. Thus, the gate lines 34 are indicated by horizontal dotted lines. However, since the gate lines 34 is underneath all the other components, FIG. 1 only shows a few horizontal dotted lines between the other components.

Figure 2:
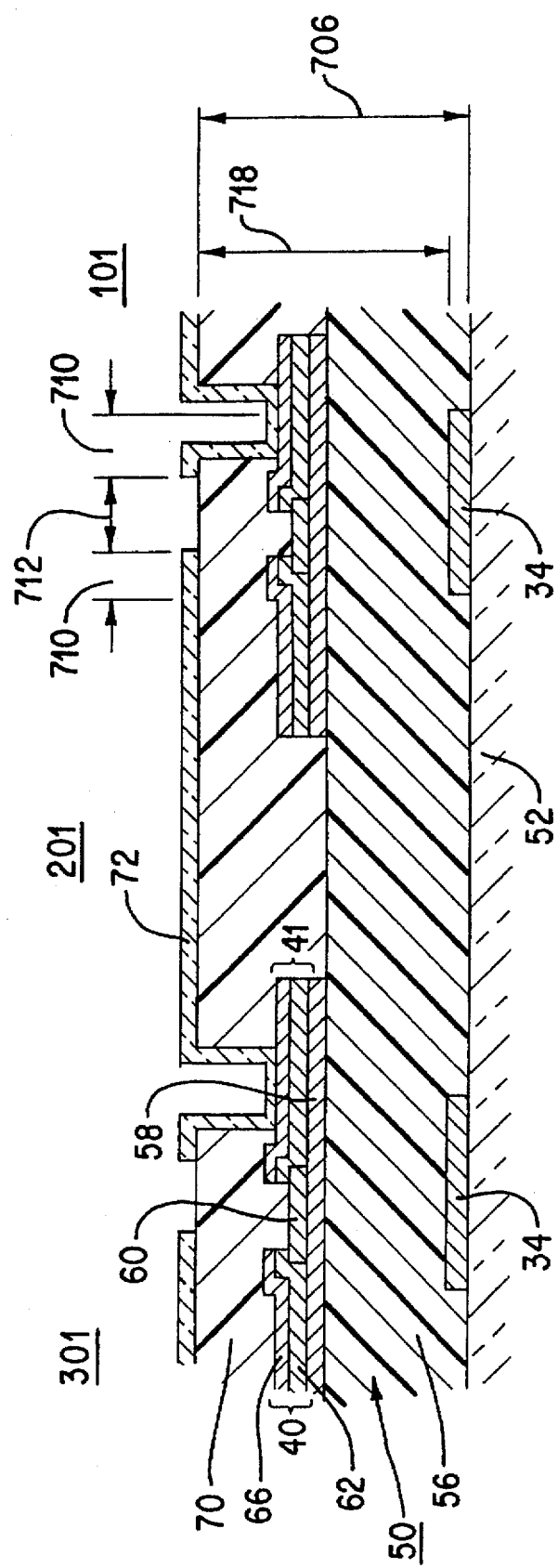
FIG. 2 is a cross-sectional view along section line II—II of FIG. 1.

FIG. 2 shows a cross-section along II—II of the pixel region 201, the TFT 50 corresponding to pixel 201 and the TFT 50 corresponding to pixel 101. The gate lines 34 are formed over the substrate 52. A gate insulating layer 56 is formed over the substrate 52 and the gate lines 34. Amorphous silicon layers 58 are formed over segments of the gate lines 34 on the surface of the gate insulating layer 56. The segments of the gate lines serve as gate electrodes for the TFTs 50. There are no additional structures extending from the gate lines 34 along their lengths to form the gate electrodes.

Etch stoppers 60 as shown in FIGS. 1 and 2 are formed over each segment of the gate lines 34 which serves as gate electrodes. n+ layers 62 are formed over the amorphous layers 58 and parts of the etch stoppers 60. Metal layers 66 are placed over the n+ layers 62. The metal layers 66 and n+ layers 62 form the source electrode 40 and drain electrode 41 of each TFT 50. Thus, each TFT 50 comprises the source electrode 40, the drain electrode 41, the etch stopper 60, the amorphous silicon 58 and a portion of the gate insulating layer 56 that is formed over the segment of the gate line 34 that serves as a gate electrode.

A passivation layer 70 is formed over the TFTs 50 and the gate insulating layer 56. The passivation layer 70 is etched to expose the drain electrodes 41 and an ITO layer is formed over the passivation layer 70 and the drain electrodes 41. The ITO layer is patterned and etched to form the pixel electrodes 72.

The pixel electrode 72 corresponding to pixel region 201 is separated from the adjacent pixel electrodes 72 corresponding to pixel regions 101 and 301. The gap 712 between adjacent pixel electrodes 72 permits light to escape when the pixel 38 is dark for a normally clear liquid crystal material or when signals on the data or gate lines 32 or 34 changes the state of the normally opaque liquid crystal material. Thus the pixel electrode 72 is patterned so that the pixel electrode 72 extends over the gate line 34 by an overlap 710. Since the pixel electrode capacitor 74 holds the voltage potential of the pixel electrode 72 constant, the overlap 710 of the pixels electrode 70 over the opaque data and gate lines 32 and 34 functions as a dark matrix to block light escaping through the gaps between the pixel electrodes 72.

Figure 3:
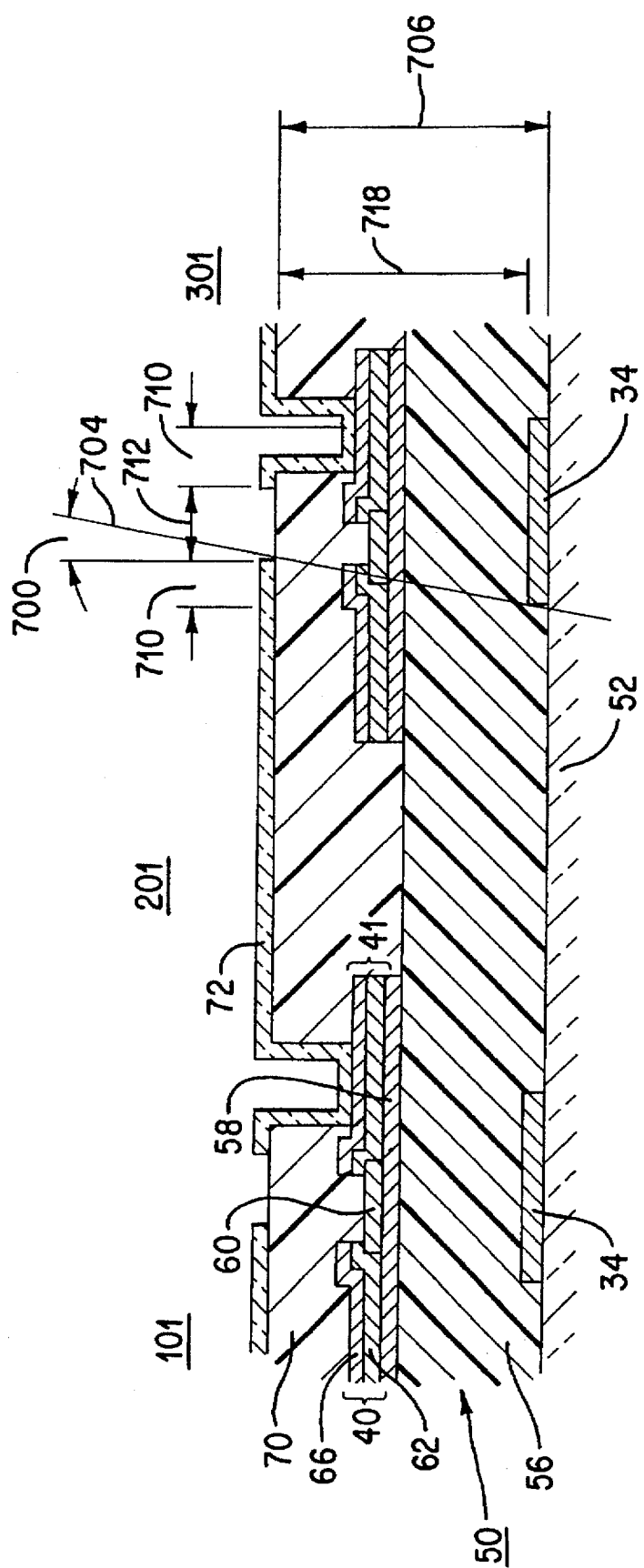
FIG. 3 shows a ray of light going through a gap between two pixel electrodes of FIG. 1.

FIG. 3 shows a ray 704 of light escaping through the gap 712. The ray 704 forms a viewing angle 700 with a line perpendicular to the surface of the substrate 52. The magnitude of the viewing angle 700 is dependent on the relative values of the overlap 710 and the separating distance 718 between the bottom surface of the pixel electrode 72 and the top surface of the gate line 34.

For this embodiment, the passivation layer 70 is about 6000 Å thick and the gate insulating layer 56 is about 3000 Å thick. Thus the separating distance 706 between the surface of the substrate 52 and the bottom surface of the pixel electrode 72 is about 9000 Å. Since the passivation layer 70 and the gate insulating layer 56 are formed over the gate line 34, the gate line thickness does not affect the thicknesses of the passivation layer 70 and the gate insulating layer 56. Thus, the separating distance 718 between the bottom of the pixel electrode 72 and the top surface of the gate line is also about 9000 Å.

To obtain a viewing angle of greater than 60 degrees, the overlap 710 must be at least about twice the separating distance 718. The tangent of the viewing angle is equal to the ratio of the separating distance 718 and the overlap 710. For a viewing angle of over 60 degrees, the ratio of the separating distance 718 and the overlap 710 must be greater than the tangent of 60 degrees. Since TAN 60=√3=1.732, the ratio of the overlap 710 and the separating distance 718 must be greater than 1.732 or about 2. Thus, for a viewing angle of greater than 60 degrees, the overlap 710 should be about twice the separating distance 718. Accordingly, when the separating distance 718 is about 9000 Å, the overlap should be greater than 18000 Å to achieve a viewing angle of over 60 degrees.

The viewing angle is also affected by the accuracy of the etching process. The photoresist pattern is shaped by a mask that is physically aligned with the structure already formed on the substrate 52. The combined masking and etching process is usually accurate to within about 1 micron. Thus, to guarantee a viewing angle of greater than 60 degrees, the overlap 710 must be at least 1 micron greater than 18000 Å. Since 1 micron is equal to 10,000 Å, to guarantee a viewing angle of greater than 60 degrees, the overlap 710 must be greater than 28000 Å or about 3 microns. Accordingly, the pixel electrode 72 must overlap the gate line 34 by about 3 microns to achieve a viewing angle of greater than 60 degrees.

Figure 4:
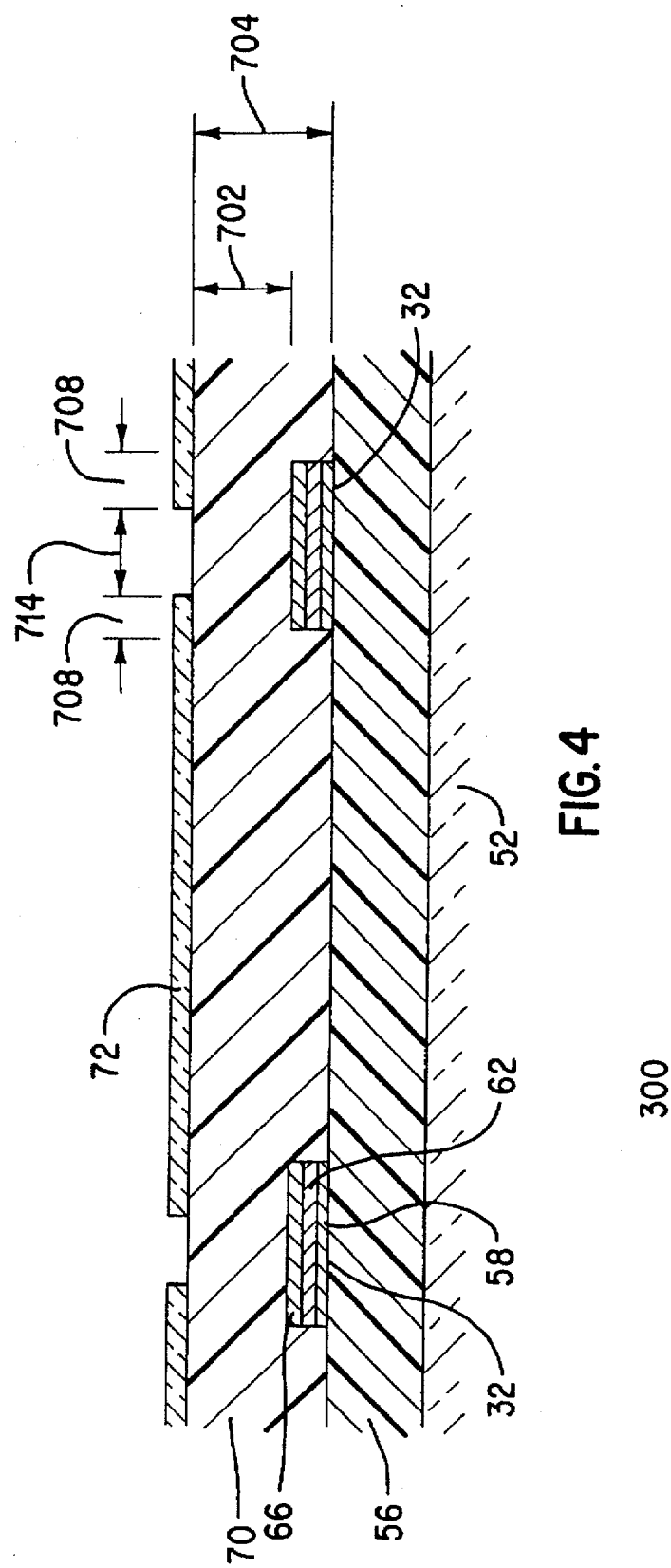
FIG. 4 is a cross-sectional view along section line IV—IV of FIG. 1.

FIG. 4 shows a cross-section of the data lines 32 along section line IV—IV. The amorphous silicon layer 58, the n+ layers 62 and the metal layers 66 form the data lines 32. The data lines 32 are formed above the surface of the gate insulating layer 56. Thus to obtain a viewing angle of greater than 60 degrees, the overlap 708 between the pixel electrode 72 and the data line 32 should be about twice the separating distance 702 between the bottom surface of the pixel electrode 72 and the top surface of the data line 32.

The passivation layer 70 has a thickness of about 6000 Å. The passivation layer 70 is formed over the data line 32 and thus the data line 32 does not appreciably affect the separating distance 702 between the bottom surface of the pixel electrode 72 and the top surface of the data line 32. Accordingly, the separating distance 702 is about 6000 Å. To obtain a viewing angle of greater than 60 degrees, the overlap 708 must be greater than about 12000 Å. Accounting for the mask alignment accuracy of about 1 micron, the overlap must be greater than about 22,000 Å or about 2.1 microns to achieve a viewing angle of greater than 60 degrees.

Figure 5:
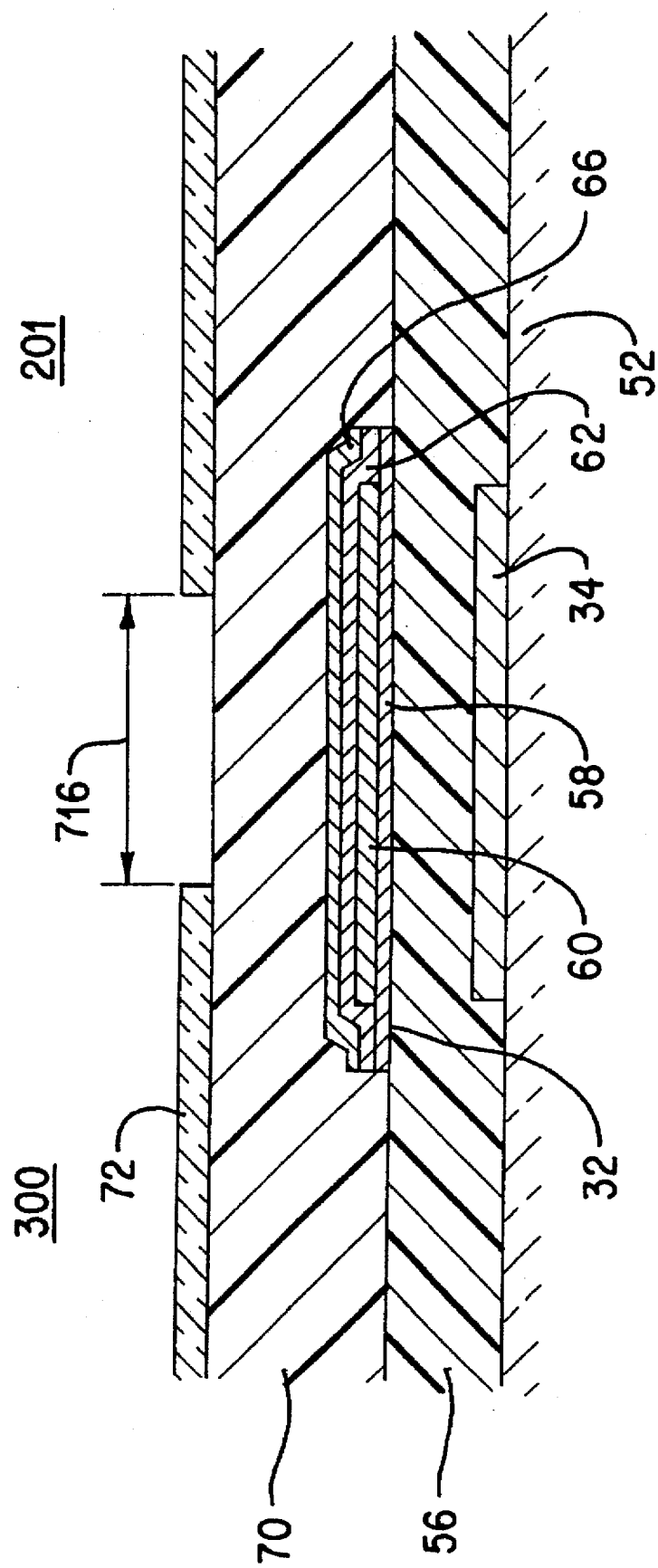
FIG. 5 is a cross-sectional view along section line V—V of FIG. 1.

FIG. 5 shows the structure of the intersection between the data line and the gate line along cross-section V—V. The gate lines 34 are formed over the substrate surface 52. The gate insulating layer 56 is formed over the substrate surface and the gate lines 34. The data lines 32 are formed over the gate insulating layer 56.

The etch stopper layer 60 is formed at the intersection between the amorphous silicon layer 58 and the n+ layer 62 of the data lines 32. This etch stopper layer 60 provides additional protection against shorts between the data lines 32 and the gate lines 34. Pin holes develop in the gate insulative layer 56 and the amorphous silicon layer 58. The n+ layer 62 and the metal layer 66 of the data lines 32 may form a contact to the gate lines 34 through the pin holes. The etch stopper layer 60 prevents this undesirable contact from forming.

The passivation layer 70 is formed over the gate insulating layer 56 and the data lines 32. The pixel electrodes 72 are formed over the passivation layer 70. The pixel electrodes 72 in FIG. 5 correspond to pixel 300 and pixel 201 and form a gap 716.

When the overlap 708 between the pixel electrode 72 and the data line 32 is greater than 2 microns, the viewing angle along the cross-section V—V will also be greater than 60 degrees. Since the separating distance 718 remains constant across the cross-section V—V while the overlap increases across a diagonal cut, the viewing angle increases along cross-section V—V.

The overlap of the pixel electrodes 72 over the gate lines 34 and data lines 32 introduces additional coupling capacitances between the pixel electrodes 72 and the gate and data lines 34 and 32, respectively. However, these parasitic capacitance values are small compared to the pixel electrode capacitor capacitance values. Thus, the noise effects caused by the additional parasitic capacitances are masked by the pixel electrode capacitors 74.

Since the dark matrix is obtained by overlapping the pixel electrodes 72 and the data lines 32 and gate lines 34, no new masks are introduced. The overlap is accomplished by the same masks that are used to form the gate and data lines 34 and 32, respectively, and the pixel electrodes 72.

However, the a-Si layer 58 of the TFT 50 forms the channel region of the TFT 50 and is very sensitive to light. When light enters the channel region of the TFT 50, the TFT 50 generates the leakage current which may cause the voltage potential of the pixel electrodes 72 to follow the data line voltages. For a normally opaque liquid crystal material, if sufficient light enters the TFT channel regions, the pixel electrodes 72 may become partially activated changing the state of the liquid crystal material. If this process continues, the pixel electrodes 72 activate erroneously. An opposite effect occurs for the normally clear liquid crystal material. The pixel becomes erroneously dark when the pixel electrodes 72 activate erroneously.

To guard against this potential problem, the dark matrix on the common electrode is retained to block light from affecting the TFT 50. Since the dark matrix no longer sets the aperture of the pixel, the dark matrix alignment requirements can be relaxed which simplifies the manufacturing process.

Moreover, instead of using the dark matrix to block light from the TFT 50, light filters can be used. For a color display, red, green and blue filters are used to cover the pixels. Light is sufficiently reduced by these filters to protect the TFTs 50. Since these filters can be formed to cover the TFT 50 without difficulty, processing steps required to form the dark matrix can be eliminated resulting in savings of at least one processing step.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. An active matrix liquid crystal display device, comprising:
   a plurality of gate lines formed over a substrate;
   a plurality of data lines formed over the substrate; and
   a plurality of pixel electrodes formed over the substrate, wherein a perimeter of each of the pixel electrodes overlaps at least a portion of the gate lines and a portion of the data lines.

2. The active matrix liquid crystal display device of claim 1, wherein the pixel electrodes are a first distance above the gate lines and a second distance above the data lines, the perimeter of each of the pixel electrodes having at least a first portion overlapping the portion of the gate lines by at least twice the first distance and a second portion overlapping the portion of the data lines by at least twice the second distance to obtain a viewing angle of at least 60 degrees.

3. The active matrix liquid crystal display device of claim 2, wherein a separating distance between a bottom surface of the pixel electrodes and a top surface of the gate lines is about 9000 Å and the pixel electrodes overlap the gate lines by about 3 microns.

4. The active matrix liquid crystal display device of claim 2, wherein a separating distance between a bottom surface of the pixel electrodes and a top surface of the data lines is about 6000 Å and the pixel electrodes overlap the data lines by about 2.1 microns.

5. The active matrix liquid crystal display device of claim 1, further comprising:
   a plurality of transistors formed over the gate lines, wherein each of the gate lines has a plurality of segments and each of the plurality of segments of each gate line is a gate electrode of one of the plurality of transistors.

6. The active matrix liquid crystal display device of claim 5, wherein the pixel electrodes are a first distance above the gate lines and a second distance above the data lines, the perimeter of each of the pixel electrodes having at least one of a first portion overlapping the portion of the gate lines by at least twice the first distance and a second portion overlapping the portion of the data lines by at least twice the second distance to obtain a viewing angle of at least 60 degrees.

7. The active matrix liquid crystal display device of claim 6, wherein a separating distance between a bottom surface of the pixel electrodes and a top surface of the gate lines is about 9000 Å and the pixel electrodes overlap the gate lines by about 3 microns.

8. The active matrix liquid crystal display device of claim 6, wherein a separating distance between a bottom surface of the pixel electrodes and a top surface of the data lines is about 6000 Å and the pixel electrodes overlap the data lines by about 2.1 microns.

9. A method for manufacturing a dark matrix for an active matrix liquid crystal display device, comprising:
   forming a plurality of gate lines over a substrate;
   forming a plurality of data lines over the substrate;
   forming a plurality of pixel electrodes over the substrate; and overlapping a perimeter of each of the pixel electrodes over at least a portion of the gate lines and a portion of the data lines.

10. The method of claim 9, wherein the plurality of pixel electrodes are a first distance above the gate lines and a second distance above the data lines, a first portion of the perimeter of the pixel electrodes overlapping the portion of the gate lines by at least twice the first distance and a second portion of the perimeter of the pixel electrodes overlapping the portion of the data lines by at least twice the second distance to obtain a viewing angle of at least 60 degrees.

11. The method of claim 10, wherein a separating distance between a bottom surface of the pixel electrodes and a top surface of the gate lines is about 9000 Å and the pixel electrodes overlap the gate lines by about 3 microns.

12. The method of claim 10, wherein a separating distance between a bottom surface of the pixel electrodes and a top surface of the data lines is about 6000 Å and the pixel electrodes overlap the data lines by about 2.1 microns.

* * * * *